(12) United States Patent
Dando

(10) Patent No.: US 7,588,804 B2
(45) Date of Patent: Sep. 15, 2009

(54) REACTORS WITH ISOLATED GAS CONNECTORS AND METHODS FOR DEPOSITING MATERIALS ONTO MICRO-DEVICE WORKPIECES

(75) Inventor: Ross S. Dando, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 490 days.

(21) Appl. No.: 10/922,039

(22) Filed: Aug. 19, 2004

(65) Prior Publication Data

US 2005/0016984 A1     Jan. 27, 2005

Related U.S. Application Data

(62) Division of application No. 10/222,289, filed on Aug. 15, 2002, now Pat. No. 6,955,725.

(51) Int. Cl.
| | | |
|---|---|---|
| C23C 16/455 | (2006.01) | |
| C23C 16/44 | (2006.01) | |
| C23C 16/22 | (2006.01) | |
| C23C 16/30 | (2006.01) | |

(52) U.S. Cl. .................... 427/593; 427/248.1; 427/250; 427/255.11; 427/255.23

(58) Field of Classification Search ................. 427/593, 427/248.1, 250, 255.11, 255.23
See application file for complete search history.

(56) References Cited

U.S. PATENT DOCUMENTS

| 0,127,031 A | 5/1872 | Dayton |
|---|---|---|
| 0,131,943 A | 10/1872 | Dayton |
| 0,579,269 A | 3/1897 | Hent |
| 1,741,519 A | 12/1926 | Huff |
| 2,508,500 A | 5/1950 | de Lange |

(Continued)

FOREIGN PATENT DOCUMENTS

DE     4003882     8/1991

(Continued)

OTHER PUBLICATIONS

UC Berkeley Extension, Engineering, "Atomic Layer Deposition," Dec. 11, 2001, 5 pages, http://www.unex.berkeley.edu/eng/br335/1-1.html.

(Continued)

*Primary Examiner*—Rudy Zervigon
(74) *Attorney, Agent, or Firm*—Perkins Coie LLP

(57) ABSTRACT

Reactors having isolated gas connectors, systems that include such reactors, and methods for depositing materials onto micro-devices workpieces are disclosed herein. In one embodiment, a reactor for depositing material onto a micro-device workpiece includes a reaction chamber, a lid attachable to the reaction chamber, and a connector. The connector has a first portion coupled to the lid, a second portion coupled to the reaction chamber, a gas passageway extending through the first and second portions, and a seal. The seal can surround the gas passageway between the first and second portions. The first portion is detachably coupled to the second portion. In one aspect of this embodiment, the connector can also include a second gas passageway extending through the first and second portions and a second seal surrounding the second gas passageway between the first and second portions.

8 Claims, 4 Drawing Sheets

U.S. PATENT DOCUMENTS

| | | |
|---|---|---|
| RE24,291 E | 3/1957 | Goodyer |
| 3,522,836 A | 8/1970 | King |
| 3,618,919 A | 11/1971 | Beck |
| 3,620,934 A | 11/1971 | Endle |
| 3,630,769 A | 12/1971 | Hart et al. |
| 3,630,881 A | 12/1971 | Lester et al. |
| 3,634,212 A | 1/1972 | Valayll et al. |
| 3,744,771 A | 7/1973 | Deaton |
| 3,945,804 A | 3/1976 | Shang et al. |
| 4,018,949 A | 4/1977 | Donakowski et al. |
| 4,022,928 A | 5/1977 | Piwcyzk et al. |
| 4,098,923 A | 7/1978 | Alberti et al. |
| 4,242,182 A | 12/1980 | Popescu et al. |
| 4,242,370 A | 12/1980 | Abdalla et al. |
| 4,269,625 A | 5/1981 | Molenaar et al. |
| 4,289,061 A | 9/1981 | Emmett |
| 4,313,783 A | 2/1982 | Davies et al. |
| 4,388,342 A | 6/1983 | Suzuki et al. |
| 4,397,753 A | 8/1983 | Czaja |
| 4,436,674 A | 3/1984 | McMenamin |
| 4,438,724 A | 3/1984 | Doehler et al. |
| 4,469,801 A | 9/1984 | Hirai et al. |
| 4,492,716 A | 1/1985 | Yamazaki et al. |
| 4,509,456 A | 4/1985 | Kleinert et al. |
| 4,545,136 A | 10/1985 | Izu et al. |
| 4,590,042 A | 5/1986 | Drage |
| 4,593,644 A | 6/1986 | Hanak |
| 4,595,399 A | 6/1986 | Collins et al. |
| 4,615,904 A | 10/1986 | Ehrlich et al. |
| 4,681,777 A | 7/1987 | Engelken et al. |
| 4,721,629 A | 1/1988 | Sakai et al. |
| 4,738,295 A | 4/1988 | Genser et al. |
| 4,780,178 A | 10/1988 | Yoshida et al. |
| 4,821,302 A | 4/1989 | Whitlock et al. |
| 4,826,579 A | 5/1989 | Westfall |
| 4,832,115 A | 5/1989 | Albers et al. |
| 4,871,417 A | 10/1989 | Nishizawa et al. |
| 4,894,132 A | 1/1990 | Tanaka et al. |
| 4,911,638 A | 3/1990 | Bayne et al. |
| 4,923,715 A | 5/1990 | Matsuda et al. |
| 4,948,979 A | 8/1990 | Munakata et al. |
| 4,949,669 A | 8/1990 | Ishii et al. |
| 4,962,057 A | 10/1990 | Epler et al. |
| 4,966,646 A | 10/1990 | Zdeblick |
| 4,977,106 A | 12/1990 | Smith |
| 4,988,879 A | 1/1991 | Zare et al. |
| 5,015,330 A | 5/1991 | Okumura et al. |
| 5,017,404 A | 5/1991 | Paquet et al. |
| 5,020,476 A | 6/1991 | Bay et al. |
| 5,062,446 A | 11/1991 | Anderson |
| 5,065,697 A | 11/1991 | Yoshida et al. |
| 5,076,205 A | 12/1991 | Vowles et al. |
| 5,090,985 A | 2/1992 | Soubeyrand |
| 5,091,207 A | 2/1992 | Tanaka et al. |
| 5,131,752 A | 7/1992 | Yu et al. |
| 5,136,975 A | 8/1992 | Bartholomew et al. |
| 5,139,606 A | 8/1992 | Maki |
| 5,172,849 A | 12/1992 | Barten et al. |
| 5,178,683 A | 1/1993 | Takamura |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,286,296 A | 2/1994 | Sato et al. |
| 5,325,020 A | 6/1994 | Campbell, deceased et al. |
| 5,364,219 A | 11/1994 | Takahashi et al. |
| 5,366,557 A | 11/1994 | Yu |
| 5,372,837 A | 12/1994 | Shimoyama et al. |
| 5,377,429 A | 1/1995 | Sandhu et al. |
| 5,378,502 A | 1/1995 | Willard et al. |
| 5,380,396 A | 1/1995 | Shikida et al. |
| 5,409,129 A | 4/1995 | Tsukada et al. |
| 5,418,180 A | 5/1995 | Brown |
| 5,421,957 A | 6/1995 | Carlson et al. |
| 5,427,666 A | 6/1995 | Mueller et al. |
| 5,432,015 A | 7/1995 | Wu et al. |
| 5,433,787 A | 7/1995 | Suzuki et al. |
| 5,433,835 A | 7/1995 | Demaray et al. |
| 5,445,491 A | 8/1995 | Nakagawa et al. |
| 5,453,124 A | 9/1995 | Moslehi et al. |
| 5,474,612 A | 12/1995 | Sato et al. |
| 5,477,623 A | 12/1995 | Tomizawa et al. |
| 5,480,818 A | 1/1996 | Matsumoto et al. |
| 5,496,410 A * | 3/1996 | Fukuda et al. ............... 118/725 |
| 5,498,292 A | 3/1996 | Ozaki et al. |
| 5,500,256 A | 3/1996 | Watabe et al. |
| 5,505,986 A | 4/1996 | Velthaus et al. |
| 5,522,934 A | 6/1996 | Suzuki et al. |
| 5,527,396 A | 6/1996 | Saitoh et al. |
| 5,532,190 A | 7/1996 | Goodyear et al. |
| 5,536,317 A | 7/1996 | Crain et al. |
| 5,558,717 A | 9/1996 | Zhao et al. |
| 5,562,800 A | 10/1996 | Kawamura et al. |
| 5,569,350 A | 10/1996 | Osada et al. |
| 5,575,883 A | 11/1996 | Nishikawa |
| 5,589,002 A | 12/1996 | Su |
| 5,589,110 A | 12/1996 | Motoda et al. |
| 5,592,581 A | 1/1997 | Okase et al. |
| 5,595,606 A | 1/1997 | Fujikawa et al. |
| 5,599,513 A | 2/1997 | Masaki et al. |
| 5,609,798 A | 3/1997 | Liu et al. |
| 5,624,498 A | 4/1997 | Lee et al. |
| 5,626,936 A | 5/1997 | Alderman |
| 5,640,751 A | 6/1997 | Faria |
| 5,643,394 A | 7/1997 | Maydan et al. |
| 5,654,589 A | 8/1997 | Huang et al. |
| 5,658,503 A | 8/1997 | Johnston et al. |
| 5,683,538 A | 11/1997 | O'Neill et al. |
| 5,693,288 A | 12/1997 | Nakamura et al. |
| 5,716,796 A | 2/1998 | Bull et al. |
| 5,729,896 A | 3/1998 | Dalal et al. |
| 5,733,375 A | 3/1998 | Fukuda et al. |
| 5,746,434 A | 5/1998 | Boyd et al. |
| 5,754,297 A | 5/1998 | Nulman |
| 5,766,364 A | 6/1998 | Ishida et al. |
| 5,769,950 A | 6/1998 | Takasu et al. |
| 5,769,952 A | 6/1998 | Komino et al. |
| 5,772,771 A | 6/1998 | Li et al. |
| 5,773,085 A | 6/1998 | Inoue et al. |
| 5,788,778 A | 8/1998 | Shang et al. |
| 5,792,269 A | 8/1998 | Deacon et al. |
| 5,792,700 A | 8/1998 | Turner et al. |
| 5,803,938 A | 9/1998 | Yamaguchi et al. |
| 5,819,683 A | 10/1998 | Ikeda et al. |
| 5,820,641 A | 10/1998 | Gu et al. |
| 5,820,686 A | 10/1998 | Moore |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,294 A | 12/1998 | Young et al. |
| 5,851,849 A | 12/1998 | Comizzoli et al. |
| 5,865,417 A | 2/1999 | Harris et al. |
| 5,865,887 A | 2/1999 | Wijaranakula et al. |
| 5,866,986 A | 2/1999 | Pennington |
| 5,868,159 A | 2/1999 | Loan et al. |
| 5,879,459 A | 3/1999 | Gadgil et al. |
| 5,879,516 A | 3/1999 | Kasman |
| 5,885,425 A | 3/1999 | Hsieh et al. |
| 5,895,530 A | 4/1999 | Shrotriya et al. |
| 5,902,403 A | 5/1999 | Aitani et al. |
| 5,908,947 A | 6/1999 | Vaartstra |
| 5,911,238 A | 6/1999 | Bump et al. |
| 5,932,286 A | 8/1999 | Beinglass et al. |

| | | | | | | |
|---|---|---|---|---|---|---|
| 5,936,829 | A | 8/1999 | Moslehi | 6,251,190 B1 | 6/2001 | Mak et al. |
| 5,940,684 | A | 8/1999 | Shakuda et al. | 6,255,222 B1 | 7/2001 | Xia et al. |
| 5,953,634 | A | 9/1999 | Kajita et al. | 6,263,829 B1 | 7/2001 | Schneider et al. |
| 5,956,613 | A | 9/1999 | Zhao et al. | 6,264,788 B1 | 7/2001 | Tomoyasu et al. |
| 5,958,140 | A | 9/1999 | Arami et al. | 6,270,572 B1 | 8/2001 | Kim et al. |
| 5,961,775 | A | 10/1999 | Fujimura et al. | 6,273,954 B2 | 8/2001 | Nishikawa et al. |
| 5,963,336 | A | 10/1999 | McAndrew et al. | 6,277,763 B1 | 8/2001 | Kugimiya et al. |
| 5,968,275 | A | 10/1999 | Lee et al. | 6,280,584 B1 | 8/2001 | Kumar et al. |
| 5,968,587 | A | 10/1999 | Frankel | 6,287,965 B1 | 9/2001 | Kang et al. |
| 5,972,430 | A | 10/1999 | DiMeo, Jr. et al. | 6,287,980 B1 | 9/2001 | Hanazaki et al. |
| 5,994,181 | A | 11/1999 | Hsieh et al. | 6,290,491 B1 | 9/2001 | Shahvandi et al. |
| 5,997,588 | A | 12/1999 | Goodwin et al. | 6,291,337 B1 | 9/2001 | Sidhwa |
| 5,998,932 | A | 12/1999 | Lenz | 6,294,394 B1 | 9/2001 | Erickson et al. |
| 6,006,694 | A | 12/1999 | DeOrnellas et al. | 6,297,539 B1 | 10/2001 | Ma et al. |
| 6,008,086 | A | 12/1999 | Schuegraf et al. | 6,302,964 B1 | 10/2001 | Umotoy et al. |
| 6,016,611 | A | 1/2000 | White et al. | 6,302,965 B1 | 10/2001 | Umotoy et al. |
| 6,022,483 | A | 2/2000 | Aral | 6,303,953 B1 | 10/2001 | Doan et al. |
| 6,025,110 | A | 2/2000 | Nowak | 6,305,314 B1 | 10/2001 | Sneh et al. |
| 6,032,923 | A | 3/2000 | Biegelsen et al. | 6,309,161 B1 | 10/2001 | Hofmeister |
| 6,039,557 | A | 3/2000 | Unger et al. | 6,315,859 B1 | 11/2001 | Donohoe |
| 6,042,652 | A | 3/2000 | Hyun et al. | 6,321,680 B2 | 11/2001 | Cook et al. |
| 6,045,620 | A | 4/2000 | Tepman et al. | 6,328,803 B2 | 12/2001 | Rolfson et al. |
| 6,059,885 | A | 5/2000 | Ohashi et al. | 6,329,297 B1 | 12/2001 | Balish et al. |
| 6,062,256 | A | 5/2000 | Miller et al. | 6,333,272 B1 | 12/2001 | McMillin et al. |
| 6,070,551 | A | 6/2000 | Li et al. | 6,334,928 B1 | 1/2002 | Sekine et al. |
| 6,079,426 | A | 6/2000 | Subrahmanyam et al. | 6,342,277 B1 | 1/2002 | Sherman |
| 6,080,446 | A | 6/2000 | Tobe et al. | 6,346,477 B1 | 2/2002 | Kaloyeros et al. |
| 6,086,677 | A | 7/2000 | Umotoy et al. | 6,347,602 B2 | 2/2002 | Goto et al. |
| 6,089,543 | A | 7/2000 | Freerks | 6,347,918 B1 | 2/2002 | Blahnik |
| 6,090,210 | A | 7/2000 | Ballance et al. | 6,355,561 B1 | 3/2002 | Sandhu et al. |
| 6,109,206 | A | 8/2000 | Maydan et al. | 6,358,323 B1 | 3/2002 | Schmitt et al. |
| 6,113,698 | A | 9/2000 | Raaijmakers et al. | 6,364,219 B1 | 4/2002 | Zimmerman et al. |
| 6,123,107 | A | 9/2000 | Selser et al. | 6,374,831 B1 | 4/2002 | Chandran et al. |
| 6,129,331 | A | 10/2000 | Henning et al. | 6,375,744 B2 | 4/2002 | Murugesh et al. |
| 6,139,700 | A | 10/2000 | Kang et al. | 6,383,300 B1 | 5/2002 | Saito et al. |
| 6,142,163 | A | 11/2000 | McMillin et al. | 6,387,185 B2 | 5/2002 | Doering et al. |
| 6,143,077 | A | 11/2000 | Ikeda et al. | 6,387,207 B1 | 5/2002 | Janakiraman et al. |
| 6,143,078 | A | 11/2000 | Ishikawa et al. | 6,387,324 B1 | 5/2002 | Patterson et al. |
| 6,143,659 | A | 11/2000 | Leem | 6,402,806 B1 | 6/2002 | Schmitt et al. |
| 6,144,060 | A | 11/2000 | Park et al. | 6,402,849 B2 | 6/2002 | Kwag et al. |
| 6,149,123 | A | 11/2000 | Harris et al. | 6,415,736 B1 | 7/2002 | Hao et al. |
| 6,156,393 | A | 12/2000 | Polanyi et al. | 6,419,462 B1 | 7/2002 | Horie et al. |
| 6,159,297 | A | 12/2000 | Herchen et al. | 6,420,230 B1 | 7/2002 | Derderian et al. |
| 6,159,298 | A | 12/2000 | Saito et al. | 6,420,742 B1 | 7/2002 | Ahn et al. |
| 6,160,243 | A | 12/2000 | Cozad | 6,425,168 B1 | 7/2002 | Takaku |
| 6,161,500 | A | 12/2000 | Kopacz et al. | 6,428,859 B1 | 8/2002 | Chiang et al. |
| 6,173,673 | B1 | 1/2001 | Golovato et al. | 6,432,256 B1 | 8/2002 | Raoux |
| 6,174,366 | B1 | 1/2001 | Ihantola et al. | 6,432,259 B1 | 8/2002 | Noorbakhsh et al. |
| 6,174,377 | B1 | 1/2001 | Doering et al. | 6,432,831 B2 | 8/2002 | Dhindsa et al. |
| 6,174,809 | B1 | 1/2001 | Kang et al. | 6,435,865 B1 | 8/2002 | Tseng et al. |
| 6,178,660 | B1 | 1/2001 | Emmi et al. | 6,444,039 B1 | 9/2002 | Nguyen |
| 6,179,923 | B1 | 1/2001 | Yamamoto et al. | 6,450,117 B1 | 9/2002 | Murugesh et al. |
| 6,182,603 | B1 | 2/2001 | Shang et al. | 6,451,119 B2 | 9/2002 | Sneh et al. |
| 6,183,563 | B1 * | 2/2001 | Choi et al. ................... 118/715 | 6,454,912 B1 | 9/2002 | Ahn et al. |
| 6,190,459 | B1 | 2/2001 | Takeshita et al. | 6,458,416 B1 | 10/2002 | Derderian et al. |
| 6,192,827 | B1 | 2/2001 | Welch et al. | 6,461,436 B1 | 10/2002 | Campbell et al. |
| 6,193,802 | B1 | 2/2001 | Pang et al. | 6,461,931 B1 | 10/2002 | Eldridge |
| 6,194,628 | B1 | 2/2001 | Pang et al. | 6,475,336 B1 | 11/2002 | Hubacek |
| 6,197,119 | B1 | 3/2001 | Dozoretz et al. | 6,486,081 B1 | 11/2002 | Ishikawa et al. |
| 6,199,465 | B1 | 3/2001 | Hattori et al. | 6,503,330 B1 | 1/2003 | Sneh et al. |
| 6,200,415 | B1 | 3/2001 | Maraschin | 6,506,254 B1 | 1/2003 | Bosch et al. |
| 6,203,613 | B1 | 3/2001 | Gates et al. | 6,507,007 B2 | 1/2003 | Van Bilsen |
| 6,206,967 | B1 | 3/2001 | Mak et al. | 6,508,268 B1 | 1/2003 | Kouketsu |
| 6,206,972 | B1 | 3/2001 | Dunham | 6,509,280 B2 | 1/2003 | Choi |
| 6,207,937 | B1 | 3/2001 | Stoddard et al. | 6,534,007 B1 | 3/2003 | Blonigan et al. |
| 6,210,754 | B1 | 4/2001 | Lu et al. | 6,534,395 B2 | 3/2003 | Werkhoven et al. |
| 6,211,033 | B1 | 4/2001 | Sandhu et al. | 6,534,423 B1 | 3/2003 | Turner |
| 6,211,078 | B1 | 4/2001 | Mathews | 6,540,838 B2 | 4/2003 | Sneh et al. |
| 6,214,714 | B1 | 4/2001 | Wang et al. | 6,541,353 B1 | 4/2003 | Sandhu et al. |
| 6,217,704 | B1 | 4/2001 | Kitagawa et al. | 6,551,929 B1 | 4/2003 | Kori et al. |
| 6,237,394 | B1 | 5/2001 | Harris et al. | 6,562,140 B1 | 5/2003 | Bondestam et al. |
| 6,237,529 | B1 | 5/2001 | Spahn | 6,562,141 B2 | 5/2003 | Clarke |
| 6,245,192 | B1 | 6/2001 | Dhindsa et al. | 6,573,184 B2 | 6/2003 | Park et al. |

| | | | | | | |
|---|---|---|---|---|---|---|
| 6,579,372 B2 | 6/2003 | Park et al. | | 2001/0001952 A1 | 5/2001 | Nishizawa et al. |
| 6,579,374 B2 | 6/2003 | Bondestam et al. | | 2001/0012697 A1 | 8/2001 | Mikata |
| 6,585,823 B1 | 7/2003 | Van Wijck | | 2001/0020447 A1 | 9/2001 | Murugesh et al. |
| 6,589,868 B2 | 7/2003 | Rossman | | 2001/0045187 A1 | 11/2001 | Uhlenbrock |
| 6,592,709 B1 | 7/2003 | Lubomirsky | | 2001/0050267 A1 | 12/2001 | Hwang et al. |
| 6,596,085 B1 | 7/2003 | Schmitt et al. | | 2001/0054484 A1 | 12/2001 | Komino |
| 6,602,346 B1 | 8/2003 | Gochberg et al. | | 2002/0000202 A1 | 1/2002 | Yuda et al. |
| 6,610,352 B2 | 8/2003 | Cheong et al. | | 2002/0016044 A1 | 2/2002 | Dreybrodt et al. |
| 6,613,656 B2 | 9/2003 | Li | | 2002/0020353 A1 | 2/2002 | Redemann et al. |
| 6,622,104 B2 | 9/2003 | Wang et al. | | 2002/0020498 A1 | 2/2002 | Ohmi et al. |
| 6,630,201 B2 | 10/2003 | Chiang et al. | | 2002/0042205 A1 | 4/2002 | McMillin et al. |
| 6,634,314 B2 | 10/2003 | Hwang et al. | | 2002/0073924 A1 | 6/2002 | Chiang et al. |
| 6,635,965 B1 | 10/2003 | Lee et al. | | 2002/0076507 A1 | 6/2002 | Chiang et al. |
| 6,638,672 B2 | 10/2003 | Deguchi | | 2002/0076508 A1 | 6/2002 | Chiang et al. |
| 6,638,859 B2 | 10/2003 | Sneh et al. | | 2002/0088547 A1 | 7/2002 | Tomoyasu et al. |
| 6,638,879 B2 | 10/2003 | Hsieh et al. | | 2002/0100418 A1 | 8/2002 | Sandhu et al. |
| 6,641,673 B2 | 11/2003 | Yang | | 2002/0104481 A1 | 8/2002 | Chiang et al. |
| 6,656,282 B2 | 12/2003 | Kim et al. | | 2002/0129768 A1 | 9/2002 | Carpenter et al. |
| 6,656,540 B2 | 12/2003 | Sakamoto et al. | | 2002/0132374 A1 | 9/2002 | Basceri et al. |
| 6,663,713 B1 | 12/2003 | Robles et al. | | 2002/0144655 A1 | 10/2002 | Chiang et al. |
| 6,666,982 B2 | 12/2003 | Brcka | | 2002/0185067 A1 | 12/2002 | Upham |
| 6,673,196 B1 | 1/2004 | Oyabu et al. | | 2002/0192369 A1 | 12/2002 | Morimoto et al. |
| 6,676,759 B1 | 1/2004 | Takagi et al. | | 2002/0195056 A1 | 12/2002 | Sandhu et al. |
| 6,686,594 B2 | 2/2004 | Ji et al. | | 2002/0195145 A1 | 12/2002 | Lowery et al. |
| 6,689,220 B1 | 2/2004 | Nguyen | | 2002/0195201 A1 | 12/2002 | Beer et al. |
| 6,704,913 B2 | 3/2004 | Rossman | | 2002/0197402 A1 | 12/2002 | Chiang et al. |
| 6,705,345 B1 | 3/2004 | Bifano | | 2003/0000473 A1 | 1/2003 | Chae et al. |
| 6,706,334 B1 | 3/2004 | Kobayashi et al. | | 2003/0003697 A1 | 1/2003 | Agarwal et al. |
| 6,716,284 B2 | 4/2004 | Campbell et al. | | 2003/0003730 A1 | 1/2003 | Li |
| 6,734,020 B2 | 5/2004 | Lu et al. | | 2003/0023338 A1 | 1/2003 | Chin et al. |
| 6,758,911 B2 | 7/2004 | Campbell et al. | | 2003/0024477 A1 | 2/2003 | Okuda et al. |
| 6,770,145 B2 | 8/2004 | Saito et al. | | 2003/0027428 A1 | 2/2003 | Ng et al. |
| 6,773,507 B2 | 8/2004 | Jallepally et al. | | 2003/0031794 A1 | 2/2003 | Tada et al. |
| 6,787,185 B2 | 9/2004 | Derderian et al. | | 2003/0037729 A1 | 2/2003 | DeDontney et al. |
| 6,787,463 B2 | 9/2004 | Mardian et al. | | 2003/0049372 A1 | 3/2003 | Cook et al. |
| 6,796,316 B2 | 9/2004 | Park et al. | | 2003/0066483 A1 | 4/2003 | Lee et al. |
| 6,800,139 B1 | 10/2004 | Shinriki et al. | | 2003/0090676 A1 | 5/2003 | Goebel et al. |
| 6,800,173 B2 | 10/2004 | Chiang et al. | | 2003/0094903 A1 | 5/2003 | Tao et al. |
| 6,807,971 B2 | 10/2004 | Saito et al. | | 2003/0098372 A1 | 5/2003 | Kim |
| 6,814,813 B2 | 11/2004 | Dando et al. | | 2003/0121608 A1 | 7/2003 | Chen et al. |
| 6,818,067 B2 | 11/2004 | Doering et al. | | 2003/0185979 A1 | 10/2003 | Nelson |
| 6,818,249 B2 | 11/2004 | Derderian | | 2003/0192645 A1 | 10/2003 | Liu et al. |
| 6,820,570 B2 | 11/2004 | Kilpela et al. | | 2003/0213435 A1 | 11/2003 | Okuda et al. |
| 6,821,347 B2 | 11/2004 | Carpenter et al. | | 2003/0232892 A1 | 12/2003 | Guerra-Santos et al. |
| 6,828,218 B2 | 12/2004 | Kim et al. | | 2004/0000270 A1 | 1/2004 | Carpenter et al. |
| 6,830,652 B1 | 12/2004 | Ohmi et al. | | 2004/0003777 A1 | 1/2004 | Carpenter et al. |
| 6,831,315 B2 | 12/2004 | Raaijmakers et al. | | 2004/0007188 A1 | 1/2004 | Burkhart et al. |
| 6,838,114 B2 | 1/2005 | Carpenter et al. | | 2004/0025786 A1 | 2/2004 | Kontani et al. |
| 6,845,734 B2 | 1/2005 | Carpenter et al. | | 2004/0040502 A1 | 3/2004 | Basceri et al. |
| 6,849,131 B2 | 2/2005 | Chen et al. | | 2004/0040503 A1 | 3/2004 | Basceri et al. |
| 6,858,120 B2 | 2/2005 | Ahn et al. | | 2004/0083959 A1 | 5/2004 | Carpenter et al. |
| 6,858,264 B2 | 2/2005 | Carpenter et al. | | 2004/0083960 A1 | 5/2004 | Dando |
| 6,861,094 B2 | 3/2005 | Derderian et al. | | 2004/0083961 A1 | 5/2004 | Basceri |
| 6,861,356 B2 | 3/2005 | Matsuse et al. | | 2004/0089240 A1 | 5/2004 | Dando et al. |
| 6,869,500 B2 | 3/2005 | Lee et al. | | 2004/0094095 A1 | 5/2004 | Huang et al. |
| 6,877,726 B1 | 4/2005 | Rindt et al. | | 2004/0099377 A1 | 5/2004 | Newton et al. |
| 6,878,402 B2 | 4/2005 | Chiang et al. | | 2004/0124131 A1 | 7/2004 | Aitchison et al. |
| 6,881,295 B2 | 4/2005 | Nagakura et al. | | 2004/0226507 A1 | 11/2004 | Carpenter et al. |
| 6,884,296 B2 | 4/2005 | Basceri et al. | | 2004/0226516 A1 | 11/2004 | Daniel et al. |
| 6,887,521 B2 | 5/2005 | Basceri | | 2004/0238123 A1 | 12/2004 | Becknell et al. |
| 6,905,547 B1 | 6/2005 | Londergan et al. | | 2005/0016956 A1 | 1/2005 | Liu et al. |
| 6,905,549 B2 | 6/2005 | Okuda et al. | | 2005/0022739 A1 | 2/2005 | Carpenter et al. |
| 6,916,398 B2 | 7/2005 | Chen et al. | | 2005/0028734 A1 | 2/2005 | Carpenter et al. |
| 6,926,775 B2 | 8/2005 | Carpenter et al. | | 2005/0039680 A1 | 2/2005 | Beaman et al. |
| 6,966,936 B2 | 11/2005 | Yamasaki et al. | | 2005/0039686 A1 | 2/2005 | Zheng et al. |
| 6,991,684 B2 | 1/2006 | Kannan et al. | | 2005/0045100 A1 | 3/2005 | Derderian |
| 7,022,184 B2 | 4/2006 | Van Wijck et al. | | 2005/0045102 A1 | 3/2005 | Zheng et al. |
| 7,056,806 B2 | 6/2006 | Basceri et al. | | 2005/0048742 A1 | 3/2005 | Dip et al. |
| 7,086,410 B2 | 8/2006 | Chouno et al. | | 2005/0059261 A1 | 3/2005 | Basceri et al. |
| 7,153,396 B2 | 12/2006 | Genser et al. | | 2005/0061243 A1 | 3/2005 | Sarigiannis et al. |
| 7,238,294 B2 | 7/2007 | Koops et al. | | 2005/0081786 A1 | 4/2005 | Kubista et al. |
| 7,311,947 B2 | 12/2007 | Dando et al. | | 2005/0087130 A1 | 4/2005 | Derderian |
| 7,371,332 B2 | 5/2008 | Larson et al. | | 2005/0087132 A1 | 4/2005 | Dickey et al. |

| | | | |
|---|---|---|---|
| 2005/0087302 A1 | 4/2005 | Mardian et al. |
| 2005/0103275 A1 | 5/2005 | Sasaki et al. |
| 2005/0120954 A1 | 6/2005 | Carpenter et al. |
| 2005/0126489 A1 | 6/2005 | Beaman et al. |
| 2005/0133161 A1 | 6/2005 | Carpenter et al. |
| 2005/0145337 A1 | 7/2005 | Derderian et al. |
| 2005/0164466 A1 | 7/2005 | Zheng et al. |
| 2005/0217575 A1 | 10/2005 | Gealy et al. |
| 2005/0217582 A1 | 10/2005 | Kim et al. |
| 2005/0249873 A1 | 11/2005 | Sarigiannis et al. |
| 2005/0249887 A1 | 11/2005 | Dando et al. |
| 2005/0268856 A1 | 12/2005 | Miller et al. |
| 2006/0115957 A1 | 6/2006 | Basceri et al. |
| 2006/0121689 A1 | 6/2006 | Basceri et al. |
| 2006/0134345 A1 | 6/2006 | Rueger et al. |
| 2006/0165873 A1 | 7/2006 | Rueger et al. |
| 2006/0198955 A1 | 9/2006 | Zheng et al. |
| 2006/0204649 A1 | 9/2006 | Beaman et al. |
| 2006/0205187 A1 | 9/2006 | Zheng et al. |
| 2006/0213440 A1 | 9/2006 | Zheng et al. |
| 2006/0237138 A1 | 10/2006 | Qin |

FOREIGN PATENT DOCUMENTS

| | | | |
|---|---|---|---|
| DE | 19851824 A1 | | 5/2000 |
| EP | 140246 | | 5/1985 |
| EP | 740490 | | 10/1996 |
| EP | 1167569 A1 | | 1/2002 |
| GB | 1065762 | | 4/1967 |
| GB | 1469230 | | 4/1977 |
| JP | 55108944 | | 8/1980 |
| JP | 60054443 | | 3/1985 |
| JP | 61292894 | | 12/1986 |
| JP | 62235728 | | 10/1987 |
| JP | 62263629 | | 11/1987 |
| JP | 63020490 | | 1/1988 |
| JP | 63111177 | | 5/1988 |
| JP | 63234198 A | * | 9/1988 |
| JP | 63256460 A | | 10/1988 |
| JP | 63259067 | | 10/1988 |
| JP | 6481311 | | 3/1989 |
| JP | 01273991 | | 11/1989 |
| JP | 02208925 | | 8/1990 |
| JP | 2306591 | | 12/1990 |
| JP | 03174717 | | 7/1991 |
| JP | 04064225 | | 2/1992 |
| JP | 04069933 | | 3/1992 |
| JP | 04100533 | | 4/1992 |
| JP | 04213818 | | 8/1992 |
| JP | 05024975 | | 2/1993 |
| JP | 05102025 | | 4/1993 |
| JP | 06151558 | | 5/1994 |
| JP | 06172979 | | 6/1994 |
| JP | 06201539 | | 7/1994 |
| JP | 06202372 | | 7/1994 |
| JP | 06342785 | | 12/1994 |
| JP | 7263144 | | 10/1995 |
| JP | 08034678 | | 2/1996 |
| JP | 08179307 | | 7/1996 |
| JP | 09082650 | | 3/1997 |
| JP | 10008255 | | 1/1998 |
| JP | 10200091 | | 7/1998 |
| JP | 10223719 | | 8/1998 |
| JP | 11172438 A | | 6/1999 |
| JP | 2001082682 A | | 3/2001 |
| JP | 2001254181 A | | 9/2001 |
| JP | 2001261375 A | | 9/2001 |
| JP | 2002164336 A | | 6/2002 |
| KR | 2005112371 A | | 11/2005 |
| SU | 598630 | | 2/1978 |
| WO | 9837258 A1 | | 8/1998 |
| WO | 9906610 A1 | | 2/1999 |
| WO | 0040772 A1 | | 7/2000 |
| WO | 0063952 A1 | | 10/2000 |
| WO | 0065649 A1 | | 11/2000 |
| WO | 0079019 A1 | | 12/2000 |
| WO | 0132966 A1 | | 5/2001 |
| WO | 0146490 A1 | | 6/2001 |
| WO | 02045871 A1 | | 6/2002 |
| WO | 02048427 A1 | | 6/2002 |
| WO | 02073329 A2 | | 9/2002 |
| WO | 02073660 A2 | | 9/2002 |
| WO | 02081771 A2 | | 10/2002 |
| WO | 02095807 A2 | | 11/2002 |
| WO | 03008662 A2 | | 1/2003 |
| WO | 03016587 A1 | | 2/2003 |
| WO | 03028069 A2 | | 4/2003 |
| WO | 03033762 A1 | | 4/2003 |
| WO | 03035927 A2 | | 5/2003 |
| WO | 03052807 A1 | | 6/2003 |

OTHER PUBLICATIONS

IPS Integrated Process Systems, Dec. 11, 2001, 1 page, http://www.ips-tech.com/eng/main.htm.

IPS Integrated Process Systems, Nano-ALD, Dec. 11, 2001, 2 pages, http://www.ips-tech.com/eng/pro-p2.htm.

IPS Integrated Process Systems, Nano-ALD, Dec. 11, 2001, 2 pages, http://www.ips-tech.com/eng/pro-p2-2.htm.

Deublin Company, Precision Rotating Unions, Steam Joints and Siphon Systems "Precision Rotating Connections for Water, Steam, Air, Hydraulic, Vacuum, Coolant and Hot Oil Service," http://www.deublin.com, Feb. 4, 2002, 1 page.

Deublin Company, "Rotating Unions," http://www.deublin.com/products/rotatingunions.htm, Feb. 4, 2002, 1 page.

Deublin Company, "Sealing," http://www.deublin.com/products/sealing.htm, Feb. 4, 2002, 2 pages.

Electronics Times, "Atomic Layer Deposition Chamber Works at Low Temperatures," 2 pages, Dec. 11, 2001, 2001 CMP Europe Ltd., http://www.electronicstimes.com/story/OEG20010719S0042.

The University of Adelaide Australia, Department of Chemistry, Stage 2 Chemistry Social Relevance Projects, "Spectroscopy," 2 pages, Feb. 9, 2002, http://www.chemistry.adelaide.edu.au/external/Soc-Rel/content/Spectros.htm.

Aera Corporation, "Fundamentals of Mass Flow Control," 1 page, retrieved from the Internet on Mar. 6, 2003, <http://www.aeramfc.com/funda.shtml>.

Bardell, R.L., et al., "Designing High-Performance Micro-Pumps Based on No-Moving-Parts Valves", DSC-vol. 62/ HTD-vol. 354, Microelectromechanical Systems (MEMS) ASME 1997, pp. 47-53.

Cowin, J.P., et al., "Measurement of Fast Desorption Kinetics of D2 From Tungsten by Laser Induced Thermal Desorption," Surface Science, vol. 78, pp. 545-564, 1978, North-Holland Publishing Company.

Cutting Edge Optronics, 600W QCW Laser Diode Array, Part No.: ARR48P600, 2 pages, Oct. 2001, <www.ceolaser.com>.

Eguchi, K. et al., "Composition Self-Matching Phenomena in Chemical Vapor Deposition of (Ba,Sr)TiO3 Thin Films," Electrochemical Society Proceedings vol. 98-3, pp. 179-189.

EMCO Flow Systems, "Mach One Mass Flow Controllers", 1 page, retrieved from the Internet on Nov. 7, 2003, <http://emcoflow.com/mach-one.htm>.

EMCO Flow Systems, Mach One Mass Flow Controller Product Brochure, 6 pages, retrieved from the Internet on Nov. 7, 2003, <http://www.emcoflow.com/literature/brochures_product_sheets/mach_one/ mach_one_brochure_2_01.pdf>.

Engelke, F. et al., "Determination of Phenylthiohydantoin-Amino Acids by Two-Step Laser Desorption/Multiphoton Ionization," Anal. Chem., vol. 59, pp. 909-912, 1987.

Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation, Cleveland, OH, 1998).

Henning, A.K. et al., "Contamination Reduction Using MEMS-BASED, High-Precision Mass Flow Controllers," Proceedings, SEMICON West Symposium on Contamination Free Manufacturing for Semiconductor Processing (SEMI, Mountain View, CA, 1998), pp. 1-11.

Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.

Henning, A.K., "Microfluidic MEMS," Proceedings, IEEE Aerospace Conference, Paper 4.906 (IEEE Press, Piscataway, NJ, 1998), 16 pages.

Henning, A.K., et al., "A thermopneumatically actuated microvalve for liquid expansion and proportional control", Proceedings, Transducers '97:1997 International Solid State Sensors and Actuators Conference, pp. 825-828.

Henning, A.K., et al., "Microfluidic MEMS for Semiconductor Processing," IEEE Trans. Components, Packaging, and Manufacturing Technology B21, pp. 329-337, 1998.

Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).

Henning, A.K., et al., "Performance of Mems-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.

Kawahara, T. et al., "Step Coverage and Electrical Properties of (BA,Sr)TiO3 Films Prepared by Liquid Source Chemical Vapor Deposition," Electrochemical Society Proceedings, vol. 98-3, pp. 190-195.

Maillefer, D., et al., "A High-Performance Silicon Micropump for Disposable Drug Delivery Systems," pp. 413-417, IEEE, 2001.

Olsson, A., "Valve-less Diffuser Micropumps", ISSN 0281-2878, 66 pages, 1998.

Peters, Laura, "Thermal Processing's Tool of Choice: Single-Wafer RTP or Fast Ramp Batch?" Semiconductor International, Apr. 1, 1998, 8 pages.

Ready, J., "Effects Due to Absorption of Laser Radiation," J. App. Physics, vol. 36, pp. 462-468, 1965.

SemiZone, "EMCO Flow Systems Granted Patent for the Mach One Mass Flow Controller for the Semiconductor Industry (Jun. 28, 2001)", 2 pages, retrieved from the Internet on Nov. 7, 2003, <http://www.semizone.com/ newsitem?news_item_id=100223>.

Takahashi, K et al., "Process Integration of 3D Chip Stack with Vertical Interconnection," pp. 601-609, 2004 Electronic Components and Technology Conference, IEEE, Jun. 2004.

Tokyo Electron Limited, Plasma Process System Trias® SPA, 1 page, retrieved from the Internet on Jul. 16, 2003, <http://www.tel.com/eng/products/spe/sdtriasspa.htm>.

Zare, R.N. et al., "Mass Spectrometry of Molecular Adsorbates Using Laser Desorption/Laser Multiphoton Ionization," Bull. Chem. Soc. Jpn., vol. 61, pp. 87-92, 1988.

MKS Instruments, Data Sheet, Downstream Plasma Source, Type AX7610, 4 pages, Dec. 2002, <http://www. mksinst.com/docs/UR/ASTEXax7610DS.pdf>.

"Selective Deposition with 'Dry' Vaporizable Lift-Off Mask," IBM Technical Disclosure Bulletin, vol. 35, Issue 1A, pp. 75-76, Jun. 1, 1992.

Wright, D.R., et. al. , "Manufacturing issues of electrostatic chucks," J. Vac. Sci. Technol. B 13(4), pp. 1910-1916, Jul./Aug. 1995, American Vacuum Society.

MKS Instruments, ASTeX® Microwave Plasma Sources and Subsystems, 1 page, retrieved from the Internet on Nov. 19, 2004, <http://www.mksinst.com/PRG2.html>.

U.S. Appl. No. 09/651,037, Mardian, Aug. 30, 2000.

* cited by examiner

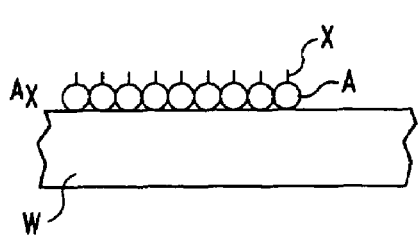
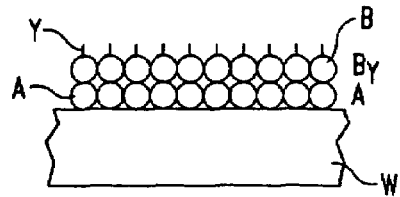
Fig. 1A
(Prior Art)
Fig. 1B
(Prior Art)
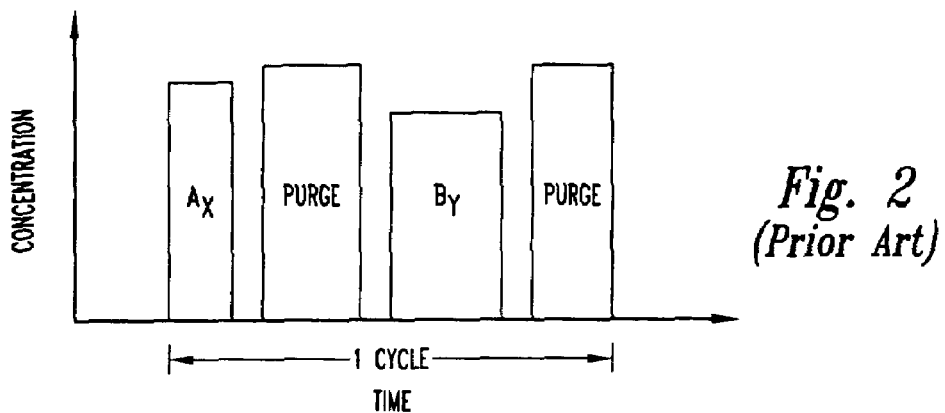
Fig. 2
(Prior Art)
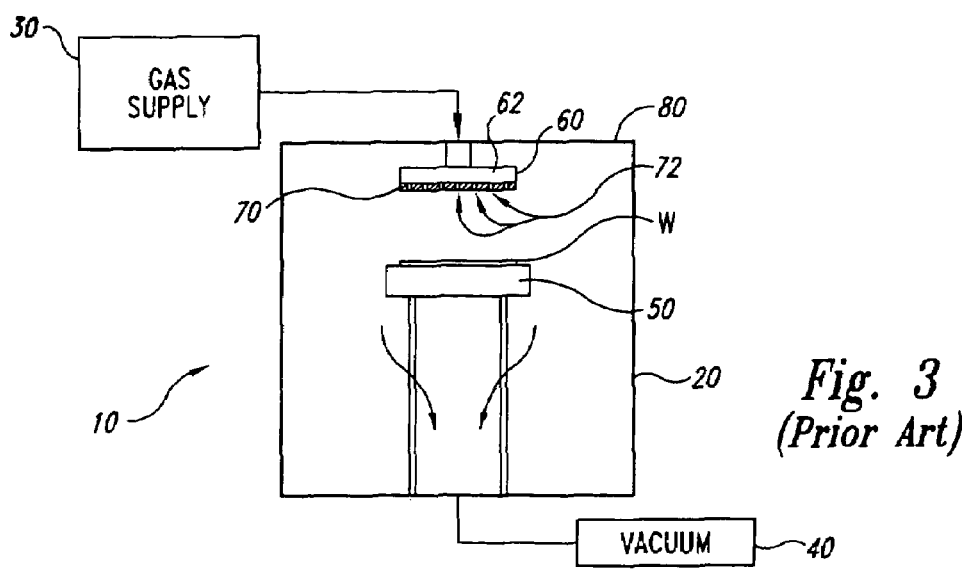
Fig. 3
(Prior Art)

REACTORS WITH ISOLATED GAS CONNECTORS AND METHODS FOR DEPOSITING MATERIALS ONTO MICRO-DEVICE WORKPIECES

CROSS-REFERENCE TO RELATED APPLICATION

This application is a divisional of U.S. patent application No. 10/222,289, entitled "REACTORS WITH ISOLATED GAS CONNECTORS AND METHODS FOR DEPOSITING MATERIALS ONTO MICRO-DEVICE WORKPIECES," filed Aug. 15, 2002 now U.S. Pat. No. 6,955,725, which is incorporated herein by reference in its entirety.

TECHNICAL FIELD

The present invention is related to reactors with isolated gas connectors and methods for depositing materials in thin film deposition processes used in the manufacturing of micro-devices.

BACKGROUND

Thin film deposition techniques are widely used in the manufacturing of micro-devices to form a coating on a workpiece that closely conforms to the surface topography. The size of the individual components in the devices is constantly decreasing, and the number of layers in the devices is increasing. As a result, the density of components and the aspect ratios of depressions (e.g., the ratio of the depth to the size of the opening) are increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a thin solid film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Atomic Layer Deposition (ALD) is another thin film deposition technique. FIGS. 1A and 1B schematically illustrate the basic operation of ALD processes. Referring to FIG. 1A, a layer of gas molecules $A_x$ coats the surface of a workpiece W. The layer of $A_x$ molecules is formed by exposing the workpiece W to a precursor gas containing $A_x$ molecules, and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing, several cycles are repeated to build a thin film on a workpiece having the desired thickness. For example, each cycle may form a layer having a thickness of approximately 0.5-1.0 Å, and thus it takes approximately 60-120 cycles to form a solid layer having a thickness of approximately 60 Å.

FIG. 3 schematically illustrates an ALD reactor 10 having a reaction chamber 20 coupled to a gas supply 30 and a vacuum 40. The reactor 10 also includes a lid 80 coupled to the reaction chamber 20, a heater 50 that supports the workpiece W, and a gas dispenser 60 in the reaction chamber 20. The gas dispenser 60 includes a plenum 62 operatively coupled to the gas supply 30 and a distributor plate 70 having a plurality of holes 72. In operation, the heater 50 heats the workpiece W to a desired temperature, and the gas supply 30 selectively injects the first precursor $A_x$, the purge gas, and the second precursor $B_y$ as shown above in FIG. 2. The vacuum 40 maintains a negative pressure in the chamber to draw the gases from the gas dispenser 60 across the workpiece W and then through an outlet of the reaction chamber 20.

One drawback of ALD processing is that it has a relatively low throughput compared to CVD techniques. For example, ALD processing typically takes about eight to eleven seconds to perform each $A_x$-purge-$B_y$-purge cycle. This results in a total process time of approximately eight to eleven minutes to form a single thin layer of only 60 Å. In contrast to ALD processing, CVD techniques only require about one minute to form a 60 Å thick layer. The low throughput of existing ALD techniques limits the utility of the technology in its current state because ALD may be a bottleneck in the overall manufacturing process. Thus, it would be useful to increase the throughput of ALD techniques so they could be used in a wider range of applications.

Another drawback of both ALD and CVD processing is the difficulty in servicing the components in the reaction chamber 20 and/or the lid 80. The lid 80 must be removed from the reaction chamber 20 to clean the gas dispenser 60. In conventional systems, gas lines between the gas supply 30 and the lid 80 are coupled together with VCR connections that can degrade with use. For example, VCR connections typically develop leaks and need to be replaced after only a few cycles of being disconnected and reconnected. Replacing the VCR connections requires substantial downtime because it usually involves cutting the gas lines and welding new VCR connections onto the lines. This causes a significant reduction in throughput, and the new welds may fail or leak. Therefore, there is a significant need to reduce the downtime for servicing components in CVD and ALD chambers.

SUMMARY

The present invention is directed toward reactors having isolated gas connectors, systems that include such reactors, and methods for depositing materials onto micro-device workpieces. In one embodiment, a reactor for depositing material onto a micro-device workpiece includes a reaction chamber, a lid attachable to the reaction chamber, and a connector. The connector has a first portion coupled to the lid, a second portion coupled to the reaction chamber, a gas passageway extending through the first portion and the second portion, and a seal. The seal surrounds the gas passageway between the first portion and the second portion to prevent gas from leaking from the gas passageway. The first portion is detachably coupled to the second portion. In one aspect of this embodiment, the connector also includes a second gas passageway extending through the first and second portions and a second seal surrounding the second gas passageway. In another aspect of this embodiment, the first and second portions can be coupled to exterior or interior walls of the lid and reaction chamber, respectively. In yet another aspect of this embodiment, the first and second portions can be mounted directly to the lid and the reaction chamber, respectively.

In another aspect of this embodiment, the connector can further include a temperature control element proximate to the gas passageway to regulate the temperature of the gas. The temperature control element can be any device that heats and/or cools the gas, such as an electric heater, a gas heater, or a heat exchanger. In still another aspect of this embodiment, the first portion and/or the second portion can include a low pressure recess proximate to the gas passageway. In this embodiment, the first portion and/or the second portion can also include a leakage channel coupled to the low pressure recess to remove from the connector gas that leaks from the gas passageway into the low pressure recess.

The connectors can be used to perform several methods for depositing materials onto micro-device workpieces. In one embodiment, a method for providing gas to the reactor includes flowing a gas through a first gas passageway section in the first block coupled to the reaction chamber and flowing the gas through a second gas passageway section in the second block coupled to the lid. The first gas passageway section is sealably coupled to the second gas passageway section, and the first block is detachably coupled to the second block. In a further aspect of this embodiment, the method can include heating the gas to a desired temperature in the first and/or second gas passageway section.

BRIEF DESCRIPTION OF THE DRAWINGS

FIGS. 1A and 1B are schematic cross-sectional views of stages in ALD processing in accordance with the prior art.

FIG. 2 is a graph illustrating a cycle for forming a layer using ALD techniques in accordance with the prior art.

FIG. 3 is a schematic representation of a system including a reactor for depositing a material onto a microelectronic workpiece in accordance with the prior art.

DETAILED DESCRIPTION

The following disclosure describes several embodiments of reactors having isolated gas connectors, systems including such reactors, and methods for depositing materials onto micro-device workpieces. Many specific details of the invention are described below with reference to reactors for depositing materials onto micro-device workpieces. The term "micro-device workpiece" is used throughout to include substrates upon which and/or in which microelectronic devices, micromechanical devices, data storage elements, read/write components, and other features are fabricated. For example, micro-device workpieces can be semiconductor wafers such as silicon or gallium arsenide wafers, glass substrates, insulative substrates, and many other types of materials. The term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4-6 and the following text to provide a thorough understanding of particular embodiments of the invention. A person skilled in the art will understand, however, that the invention may have additional embodiments, or that the invention may be practiced without several of the details of the embodiments shown in FIGS. 4-6.

A. Deposition Systems

Figure 4:
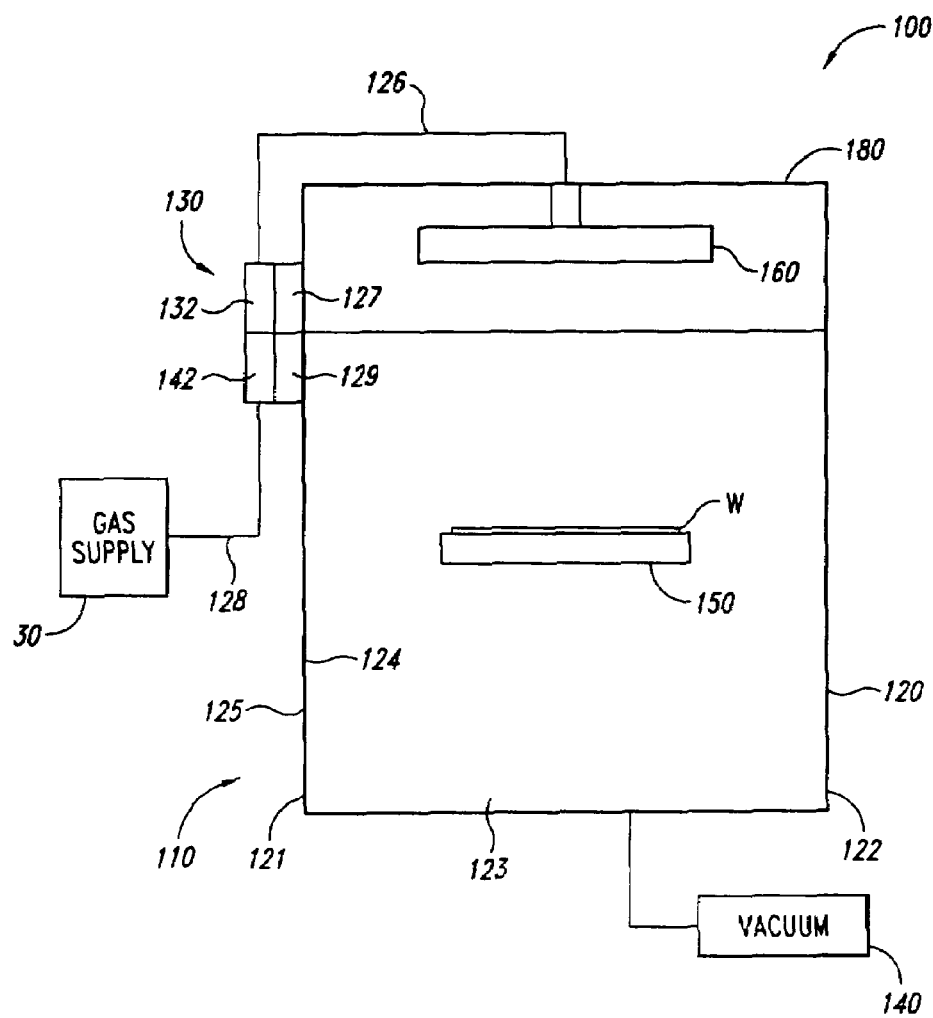
FIG. 4 is a schematic side view of a system including a reactor for depositing material onto a micro-device workpiece in accordance with one embodiment of the invention.

FIG. 4 is a schematic side view of a system 100 for depositing material onto a micro-device workpiece W in accordance with one embodiment of the invention. In this embodiment, the system 100 includes a reactor 110 having a reaction chamber 120 and a lid 180 coupled to the reaction chamber 120. The reaction chamber 120 can include a workpiece holder 150 that supports the workpiece W and a gas dispenser 160 coupled to a gas supply 30. The workpiece holder 150 can be a heater or heat sink that holds the workpiece W at a desired temperature. The gas dispenser 160 is positioned over the workpiece holder 150 to deliver the gas(es) to the workpiece W. In the embodiment shown in FIG. 4, the lid 180 carries the gas dispenser 160. The reaction chamber 120 can be coupled to a vacuum 140 to draw gases from the gas dispenser 160 across the workpiece W and then out of the reaction chamber 120.

The reactor 110 further includes a connector 130 having a first portion 132 coupled to the lid 180 and a second portion 142 coupled to the reaction chamber 120. In the illustrated embodiment, the first portion 132 is attached to a spacer 127 which is mounted to the lid 180, and the second portion 142 is attached to a spacer 129 which is mounted to the reaction chamber 120. In other embodiments, the first portion 132 and the second portion 142 can be mounted directly to the lid 180 and the reaction chamber 120, respectively. In the illustrated embodiment, the connector 130 is coupled to an external wall 125 on a first side 121 of the reaction chamber 120 and the lid 180. The connector 130 can alternatively be coupled to other portions of the reaction chamber 120 and the lid 180, such as a second side 122 or a third side 123, in other embodiments. Furthermore, in still other embodiments, the connector 130 can be coupled to internal walls 124 of the reaction chamber 120 and the lid 180.

The first portion 132 of the connector 130 is coupled to the gas dispenser 160 by a first gas conduit 126. The second portion 142 is coupled to the gas supply 30 by a second gas conduit 128. The first and second portions 132 and 142 include at least one internal gas passageway that will be discussed in detail below. The connector 130 thereby connects the first gas conduit 126 to the second gas conduit 128 so that gas can flow from the gas supply 30 to the gas dispenser 160.

B. Connectors

Figure 5:
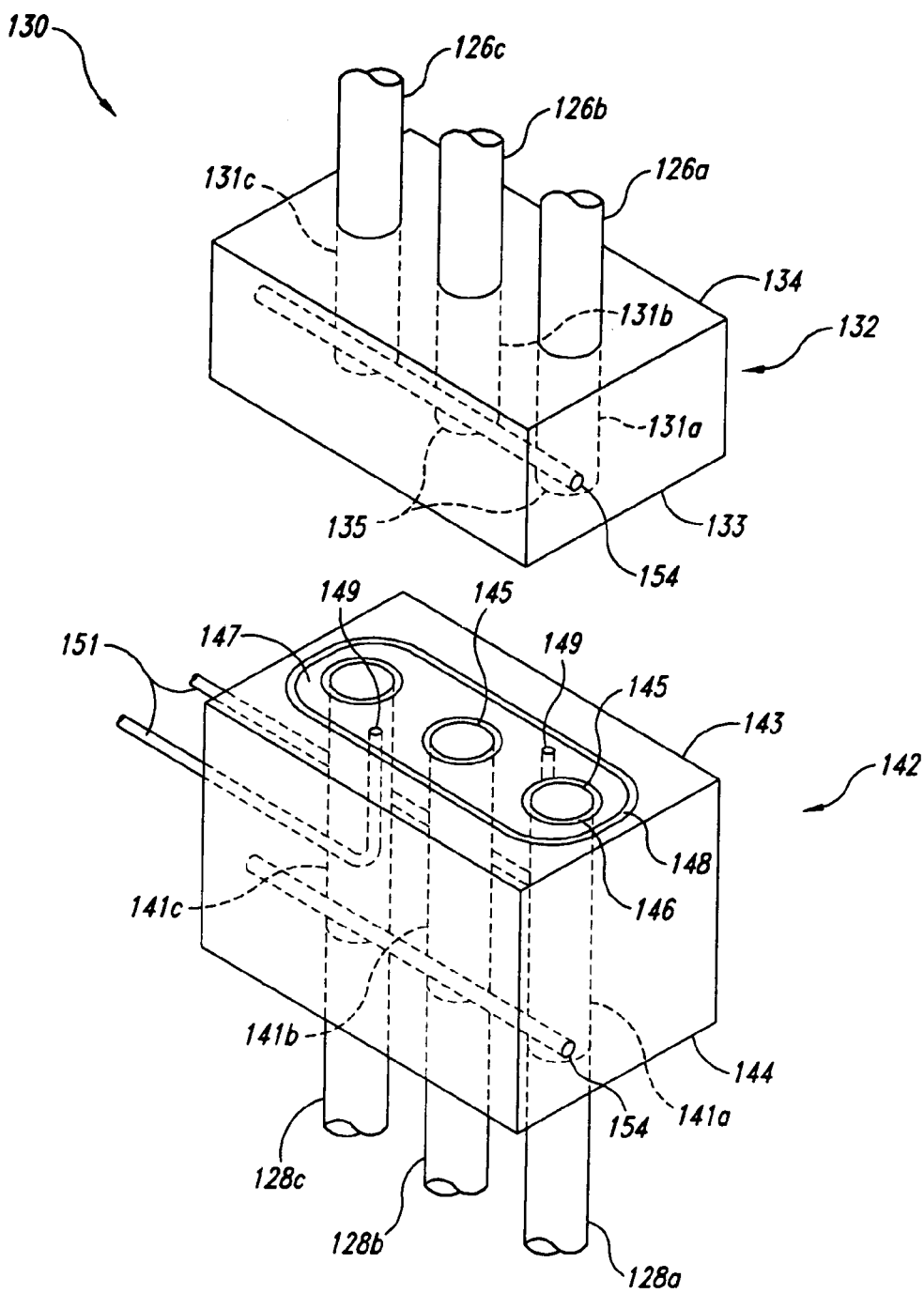
FIG. 5 is an isometric view of the connector shown in FIG. 4 with the first portion spaced apart from the second portion.

FIG. 5 is an isometric view of one embodiment of the connector 130 shown in FIG. 4 with the first portion 132 disconnected from the second portion 142. In this embodiment, the first portion 132 is a first block that includes a plurality of first gas passageway sections (identified individually as 131a-c) extending from a first side 133 to a second side 134. Each first section 131a-c is coupled to a corresponding first gas conduit (identified individually as 126a-c) proximate to the second side 134. Similarly, the second portion 142 is a second block that includes a plurality of second gas passageway sections (identified individually as 141a-c) extending from a first side 143 to a second side 144. Each second section 141a-c is coupled to a corresponding second gas conduit (identified individually as 128a-c) proximate to the second side 144. Furthermore, each first section 131a-c in the first portion 132 is axially aligned with a corresponding second section 141a-c in the second portion 142 to define individual gas passageways. For example, first section 131a is aligned with second section 141a so that gas can flow from the second gas conduit 128a, through the second and first sections 141a and 131a, and then through the first gas conduit 126a. The gas passageway sections 131a and 141a accordingly define a first passageway through the connector 130 for transporting a first gas. The gas passageway sections 131b and 141b define a second passageway through the connector 130 for transporting a second gas, and the gas passageway sections 131c and 141c define a third passageway through the connector 130 for transporting a third gas. Each passageway contains a separate, discrete flow of a gas to prevent the individual gas flows from mixing with each other in the conduits 126 and 128. In other embodiments, the connector 130 can have a different number of gas passageways. In a further aspect of the illustrated embodiment, the connector 130 can be made of a noncorrosive material, such as stainless steel or invar, that is compatible with caustic gases.

The connector 130 can also include seals 146 between inlets 135 of the first gas passageway sections 131a-c and inlets 145 of the second gas passageway sections 141a-c. The seals 146 prevent gases from leaking while flowing between the first portion 132 and the second portion 142. In other embodiments, the first side 143 of the second portion 142 and/or the first side 133 of the first portion 132 can include grooves circumscribing the inlets 135 and 145 that are sized to seat the seals 146. The seals 146 can be O-rings, gaskets or metal rings. Alternatively, the seals 146 can be a raised ridge surrounding each of the inlets 135 and a corresponding flat surface or depression around each of the inlets 145, such as a knife edge seal. It will be appreciated that the ridges can surround the inlets 145 and the receiving surfaces can surround the inlets 135. Moreover, the seals 146 can be a combination of moveable seals (e.g., O-rings) and fixed seals (e.g., knife-edge seals) around each inlet pair.

The second portion 142 can also include a low pressure recess 147 in the first side 143 and leakage channels 151 coupled to the low pressure recess 147 to remove leaked or spilled gas from inside the connector 130. The seals 146 and the inlets 145 can be located within the low pressure recess 147. Inlets 149 connect the leakage channels 151 to the low pressure recess 147. In one embodiment, a vacuum (not shown) can be coupled to the leakage channels 151 to create the low pressure in the low pressure recess 147 and to remove the leaked gas from the low pressure recess 147. The low pressure in the low pressure recess 147 prevents leaked gas from contaminating the discrete gas flows in the passageway sections 131a-c and 141a-c. The connector 130 of the illustrated embodiment further includes a seal 148 circumscribing the low pressure recess 147 to prevent leaked gas from passing out of the low pressure recess 147. In other embodiments, the connector 130 may not include the seal 148 circumscribing the low pressure recess 147. In additional embodiments, the connector 130 may not include the low pressure recess 147, or may have a low pressure recess with a different configuration, such as that described below with reference to FIG. 6. In still other embodiments, the first portion 132 may have the low pressure recess 147.

Several embodiments of the connector 130 optionally include temperature control elements 154 positioned proximate to the gas passageway sections 131a-c and 141a-c. In many embodiments, the temperature control elements 154 heat and/or cool each gas passageway section 131a-c and 141a-c individually to maintain an optimal temperature for each specific gas. The temperature control elements 154, however, can heat the gas passageway sections 131a-c and 141a-c collectively as a group in other embodiments. The temperature control elements 154 can be electric heaters, gas heaters, heat exchangers, or other devices to heat and/or cool the gas passageway sections 131a-c and 141a-c. Each temperature control element 154 can be a single unit with discrete portions or several units to control the temperature of each gas passageway section 131a-c and 141a-c individually. In other embodiments, the first portion 132 and/or the second portion 142 may not include the temperature control element 154.

In operation, the first portion 132 and the second portion 142 of the connector 130 are detachably coupled together so that gases flow from the gas supply 30 (FIG. 4) through the connector 130 to the gas distributor 160 (FIG. 4). If gas leaks while flowing from the second gas passageway sections 141a-c to the first gas passageway sections 131a-c, the low pressure recess 147 entraps the leaked gas for removal via the leakage channels 151.

Referring to FIG. 4, one advantage of the illustrated embodiment is that the lid 180 can be removed from the reaction chamber 120 without disconnecting a VCR connection in the gas conduits 126 and 128. The connector 130 eliminates the need for VCR connections that are subject to premature failure and instead provides a system with a more robust and/or replaceable seal. Several embodiments of the connector are expected to reduce the need to replace worn or faulty VCR connections. Accordingly, the illustrated embodiment reduces the downtime required to service components in the reaction chamber 120, such as replacing faulty VCR connections.

Another advantage of the illustrated embodiment is the ability to control the temperature of each gas just before introducing the gases to the gas distributor 160 (FIG. 4). Several embodiments of the connector 130 with temperature control elements 154 bring the individual gas flows to the desired temperatures in the gas conduits 126 and 128. Maintaining the desired temperature of each gas reduces condensation and degradation of the gas in the gas conduits 126 and 128. Furthermore, the temperature control elements 154 can superheat the gases just before they enter the reaction chamber 120 to produce smaller droplets. Smaller droplets are advantageous because they form a more uniform surface on the workpiece W.

Figure 6:
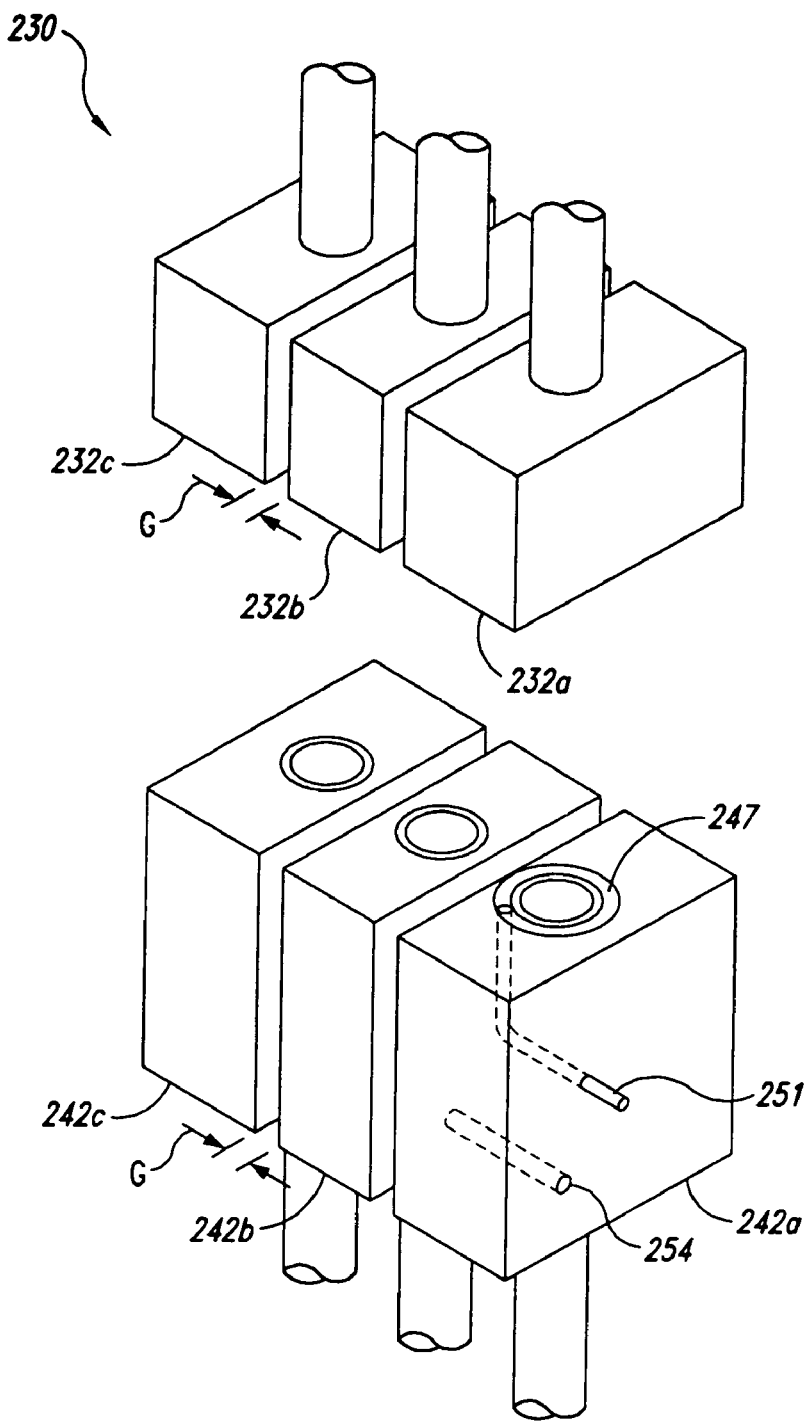
FIG. 6 is an isometric view of a connector having first portions spaced apart from second portions in accordance with another embodiment of the invention.

FIG. 6 is an isometric view of a connector 230 having first portions (identified individually as 232a-c) spaced apart from second portions (identified individually as 242a-c) in accordance with another embodiment of the invention. The first portions 232a-c are spaced apart from each other by a gap G, and each first portion 232a-c is coupled to the lid 180 (FIG. 4). Similarly, the second portions 242a-c are spaced apart from each other by the gap G, and each second portion 242a-c is coupled to the reaction chamber 120 (FIG. 4). In the illustrated embodiment, the second portion 242a includes a low pressure recess 247, a leakage channel 251, and a temperature control element 254, all of which are similar to those discussed above with reference to FIG. 5. In additional embodiments, the second portion 242a may not include all of these elements. In other embodiments, some or all of the first and second portions 232a-c and 242a-c may also include low pressure recesses, leakage conduits, and/or temperature control elements. One advantage of the embodiment illustrated in FIG. 6 is that the gap G between each first portion 232a-c and between each second portion 242a-c helps thermally insulate each portion from the adjacent portion. Furthermore, the gap G permits a cooling and/or heating gas, such as air, to move between the portions 232a-c and 242a-c to cool and/or heat each portion individually.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method for providing gas to a reactor having a lid and a reaction chamber, the reaction chamber defined by a bottom portion, a top portion, and side portions; comprising: flowing a first gas through a first gas passageway in a connector, wherein the connector has a first portion attached external to the lid, a second portion attached external to the reaction chamber and detachably coupled to the first portion, and a seal between the first and second portions and surrounding the first gas passageway, and wherein the first gas passageway extends through the first and second portions; flowing a second gas through a second gas passageway in the connector, wherein the second gas passageway extends through the first and second portions; heating the first gas in the connector to a first temperature; heating the second gas in the connector to a second temperature different from the first temperature, wherein heating the second gas occurs substantially simultaneously with heating the first gas; and vacuuming leakage of the first gas and/or the second gas from the connector.

2. The method of claim 1, further comprising flowing the first and second gases through a gas distributor.

3. The method of claim 1 wherein flowing the first gas occurs before flowing the second gas.

4. A method for providing gas to a reactor having a lid and a reaction chamber, the reaction chamber defined by a bottom portion, a top portion, and side portions; comprising: flowing a first gas through a first gas passageway in a connector, wherein the connector has a first portion attached external to the lid, a second portion attached external to the reaction chamber and detachably coupled to the first portion, and a seal between the first and second portions and surrounding the first gas passageway, and wherein the first gas passageway extends through the first and second portions; flowing a second gas through a second gas passageway in the connector, wherein the second gas passageway extends through the first and second portions, and wherein flowing the first gas occurs simultaneously with flowing the second gas; heating the first gas in the connector to a first temperature; and heating the second gas in the connector to a second temperature different from the first temperature, wherein heating the second gas occurs substantially simultaneously with heating the first gas.

5. A method for providing gas to a reactor having a lid and a reaction chamber, the reaction chamber defined by a bottom portion, a top portion, and side portions; comprising: controlling the temperature of a first gas in a first gas passageway in a connector, wherein the connector has a first portion attached external to the lid, a second portion attached external to the reaction chamber and detachably coupled to the first portion, and a seal between the first and second portions surrounding the first gas passageway; controlling the temperature of a second gas in a second gas passageway in the connector, wherein the second temperature of the second gas is different than the first temperature of the first gas; and vacuuming leakage of the first gas and/or the second gas from the connector via a low pressure recess around the first gas passageway and the second gas passageway.

6. The method of claim 5, further comprising:
flowing the first gas in the first gas passageway; and
flowing the second gas in the second gas passageway.

7. The method of claim 5 wherein controlling the temperature of the first gas occurs simultaneously with controlling the temperature of the second gas.

8. The method of claim 1 wherein vacuuming leakage of the first gas and/or the second gas from the connector comprises drawing a low pressure in a low pressure recess around the first gas passageway and the second gas passageway.

* * * * *

UNITED STATES PATENT AND TRADEMARK OFFICE
CERTIFICATE OF CORRECTION

PATENT NO. : 7,588,804 B2  Page 1 of 1
APPLICATION NO. : 10/922039
DATED : September 15, 2009
INVENTOR(S) : Ross S. Dando It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 605 days.

Signed and Sealed this

Twenty-first Day of September, 2010

David J. Kappos
*Director of the United States Patent and Trademark Office*